US007510899B2

(12) United States Patent
Kao

(10) Patent No.: US 7,510,899 B2
(45) Date of Patent: Mar. 31, 2009

(54) METHODS FOR FABRICATING A CMOS IMAGE SENSOR

(75) Inventor: Ching-Hung Kao, Hsin-Chu Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 4 days.

(21) Appl. No.: 11/836,792

(22) Filed: Aug. 10, 2007

(65) Prior Publication Data

US 2009/0042332 A1 Feb. 12, 2009

(51) Int. Cl.
*H01L 20/00* (2006.01)

(52) U.S. Cl. .......................................... 438/57; 438/70

(58) Field of Classification Search .................. 438/48, 438/57, 59, 66, 69, 70, 73, 153, 154; 430/5
See application file for complete search history.

(56) References Cited

U.S. PATENT DOCUMENTS

| | | | | |
|---|---|---|---|---|
| 6,379,992 | B2 * | 4/2002 | Jo | 438/70 |
| 6,617,189 | B1 * | 9/2003 | Chen et al. | 438/48 |
| 6,646,808 | B2 | 11/2003 | Li | |
| 6,667,212 | B1 * | 12/2003 | Shiraiwa et al. | 438/261 |
| 6,803,291 | B1 * | 10/2004 | Fu et al. | 438/401 |
| 2007/0065731 | A1 * | 3/2007 | Ishiwata | 430/5 |

* cited by examiner

*Primary Examiner*—Savitri Mulpuri
(74) *Attorney, Agent, or Firm*—Winston Hsu

(57) ABSTRACT

A method for fabricating a CMOS image sensor includes providing a substrate having a sensor array region and a peripheral region defined thereon, forming at least a contact pad on the substrate of the peripheral region, forming a first dielectric layer covering the contact pad on the substrate, performing a first etching process to expose the contact pad and to form a step height, forming an optical shielding layer on the first dielectric layer, forming a plurality of color filters on the first dielectric layer, sequentially forming a planarizing layer and a plurality of micro-lenses on the first dielectric layer.

5 Claims, 21 Drawing Sheets

METHODS FOR FABRICATING A CMOS IMAGE SENSOR

BACKGROUND OF THE INVENTION

1. Field of the Invention

The present invention relates to methods for fabricating a CMOS image sensor, and more particularly, to back-end-of-line methods for fabricating a CMOS image sensor.

2. Description of the Prior Art

As the development of electronic products such as digital cameras and scanners progresses, the demand for image sensors increases accordingly. In general, image sensors in common usage nowadays are divided into two main categories: charge coupled device (CCD) sensors and CMOS image sensors (CIS). Primarily, CMOS image sensors have certain advantages of low operating voltage, low power consumption, and an ability for random access. Furthermore, CMOS image sensors are currently capable of integration with the semiconductor fabrication process. Based on those benefits, the application of CMOS image sensors has increased significantly.

The CMOS image sensor separates incident light into a combination of light of different wavelengths. For example, the CMOS image sensor can consider incident light as a combination of red, blue, and green light. The light of different wavelengths is received by respective optically sensitive elements such as photodiodes and is subsequently transformed into digital signals of different intensities. Thus, it can be seen that a monochromatic color filter array (CFA) must be set above every optical sensor element for separating the incident light.

Please refer to FIGS. 1-5, which are schematic drawings illustrating a conventional method for fabricating a CMOS image sensor. As shown in FIG. 1, a semiconductor substrate 12 having a sensor array region 14 and a peripheral region 16 defined thereon is provided. A plurality of photodiodes 18 for receiving incident light, a plurality of shallow trench isolations (STIs) 20 positioned in between each photodiode 18, and a plurality of CMOS transistors (not shown) are formed in the semiconductor substrate 12. Then, at least a dielectric layer 22 is formed on the semiconductor substrate 12. Next, a plurality of patterned metal layers 24 for forming metal interconnects of the CMOS image sensor and for shielding scattering light are formed on the dielectric layer 22. Simultaneously, another patterned metal layer is formed on the dielectric layer 22 of the peripheral region 16 for serving as a contact pad 26 which provides electrical connection with external devices.

Please refer to FIGS. 1-2. Then, another dielectric layer 28 covering the patterned metal layer 24 and the contact pad 26 is formed on the dielectric layer 22, and a patterned photoresist (not shown) is subsequently formed on the dielectric layer 28. The patterned photoresist is used as an etching mask in an etching process to remove a portion of the dielectric layer 28 above the contact pad 26, thus an opening 30 exposing the contact pad 26 is formed as shown in FIG. 2.

Please refer to FIGS. 3-4. Following the formation of the opening 30, a cap layer 32 comprising an opaque metal material such as titanium or titanium nitride is formed on the dielectric layer 28. The cap layer 32 covers the contact pad 26. As shown in FIG. 3, a photoresist layer is formed on the cap layer 32, and the semiconductor substrate 12 is aligned with a photomask with the opening 30 serving as an alignment mark in an alignment step. Then, conventional exposure and development processes are performed to obtain a patterned photoresist 42. The patterned photoresist 42 serves as an etching mask in another etching process to remove the cap layer 32 above the contact pad 26 and above portions of the dielectric layer 28, thus an optical shielding layer 34 is formed on the dielectric layer 28 of the peripheral region 16 adjacent to the sensor array region 14 as shown in FIG. 4. The optical shielding layer 34 preferably serves to block external lights projecting from the peripheral region 16 to the sensor array region 14.

Please refer to FIG. 5. A plurality of color filters 36 are formed on the dielectric layer 28 of the sensor array region 14. The color filters 36 comprise red color filters, green color filters, blue color filters, or filters of other colors. Each color filter 36 corresponds to each of the photodiodes 18. Steps of forming the color filters 36 are summarized as follows: a green color filter layer (not shown) comprising photosensitive material is formed on the dielectric layer 28 by a spin coating method. Then a photomask containing green color filter pattern is provided and exposure and development processes are performed to transfer the pattern to the green color filter layer and obtain a plurality of green color filters. The same steps are used to form the blue color filters and the red color filters such that the formation of the color filters 36 is completed.

Please refer to FIG. 5 again. Thereafter, a planarizing layer 38 is formed on the color filters 36 and the optical shielding layer 34. And a polymer layer (not shown) composed of acrylate material is disposed on the planarizing layer 38. Next, a series of exposure, development, and baking processes are performed to form a plurality of micro-lenses 40 corresponding to each of the color filters 36, thus the back-end-of-line fabrication of the a CMOS image sensor 10 is completed.

As mentioned above, the color filter layer is formed on the dielectric layer 38 by spin coating step after forming the opening 30 which exposes the contact pad 26. It is noteworthy that the existence of the opening 30 makes the color filter layer store up in the opening 30 during the spin coating step, therefore the uniformity of a thickness of the color filter layer is adversely affected, and striation is caused. Striation is disadvantageous to the pixel performance, for example, saturation of the CMOS image sensor 10 is affected.

SUMMARY OF THE INVENTION

Therefore the present invention provides methods for fabricating a CMOS image sensor to improve the pixel performance of the CMOS image sensor and to prevent it from being affected by the striation caused during forming the color filters.

According to the claimed invention, a method for fabricating a CMOS image sensor is provided. The method comprises steps of providing a substrate having a sensor array region and a peripheral region defined thereon, forming at least a contact pad on the substrate of the peripheral region, forming a first dielectric layer covering the contact pad on the substrate, performing a first etching process to remove a portion of the first dielectric layer for exposing the contact pad and forming a step height, forming an optical shielding layer on the first dielectric layer of the peripheral region, forming a plurality of color filters on the first dielectric layer of the sensor array region, forming a planarizing layer on the color filters and the optical shielding layer, and forming a plurality of micro-lenses on the planarizing layer.

According to the claimed invention, another method for fabricating a CMOS image sensor is provided. The method comprises steps of providing a substrate having a sensor array region and a peripheral region defined thereon, forming at least a contact pad on the substrate of the peripheral region, forming a dielectric layer covering the contact pad on the substrate, performing a first etching process to remove a portion of the dielectric layer of the peripheral region and to form a plurality of step heights, forming an optical shielding layer on the dielectric layer, forming a plurality of color filters on the dielectric layer of the sensor array region, forming a planarizing layer on the color filters and the optical shielding layer, and forming a plurality of micro-lenses on the planarizing layer.

According to the methods provided by the present invention, where the contact pad positioned is a step height, not a notch or a recess, therefore the color filter layer would not store up in the notch/recess during the spin coating process. Thus the effect of striation to the pixel performance of the CMOS image sensor is prevented as the striation itself is prevented.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
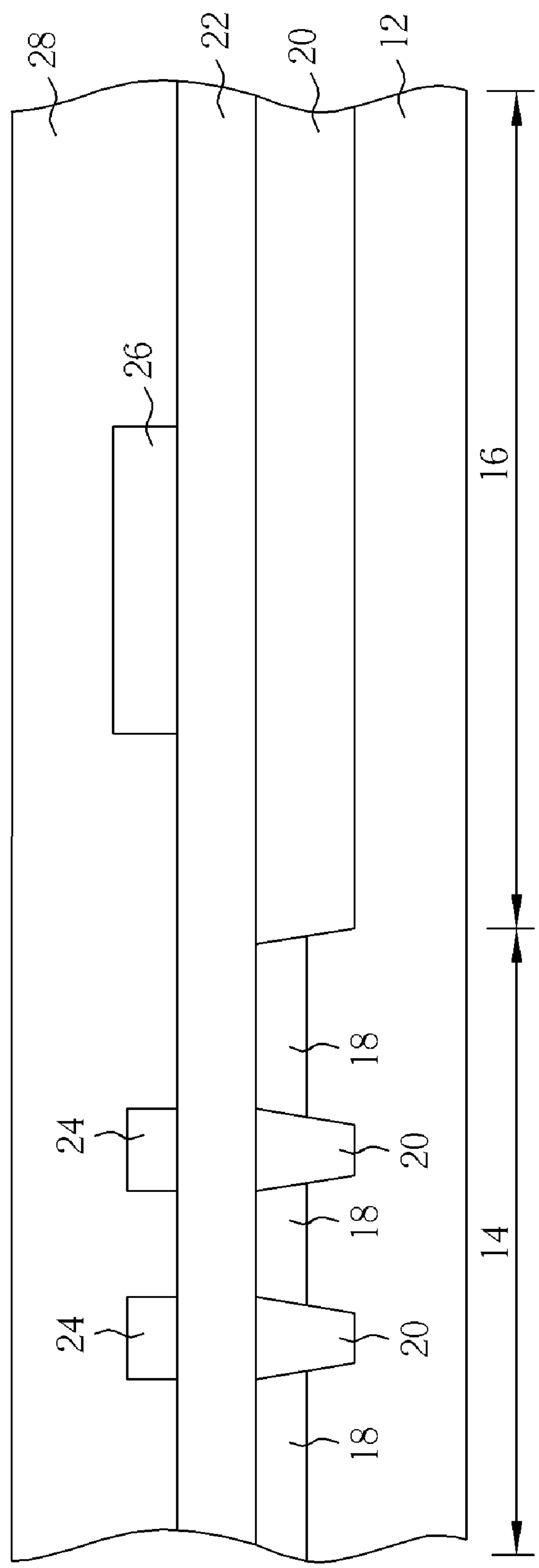
FIGS. 1-5 are schematic drawings illustrating a conventional method for fabricating a CMOS image sensor.
Figure 2:
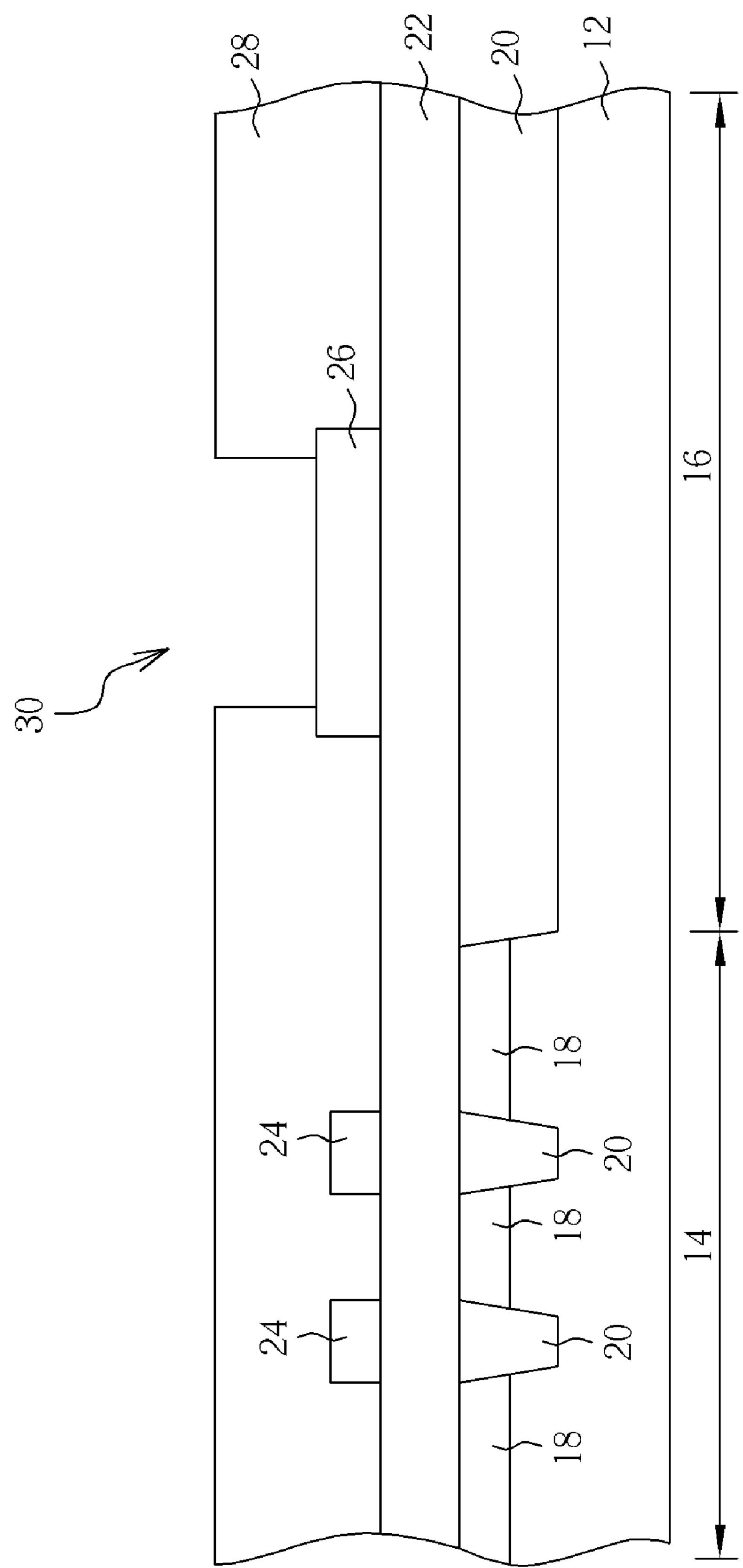
Figure 3:
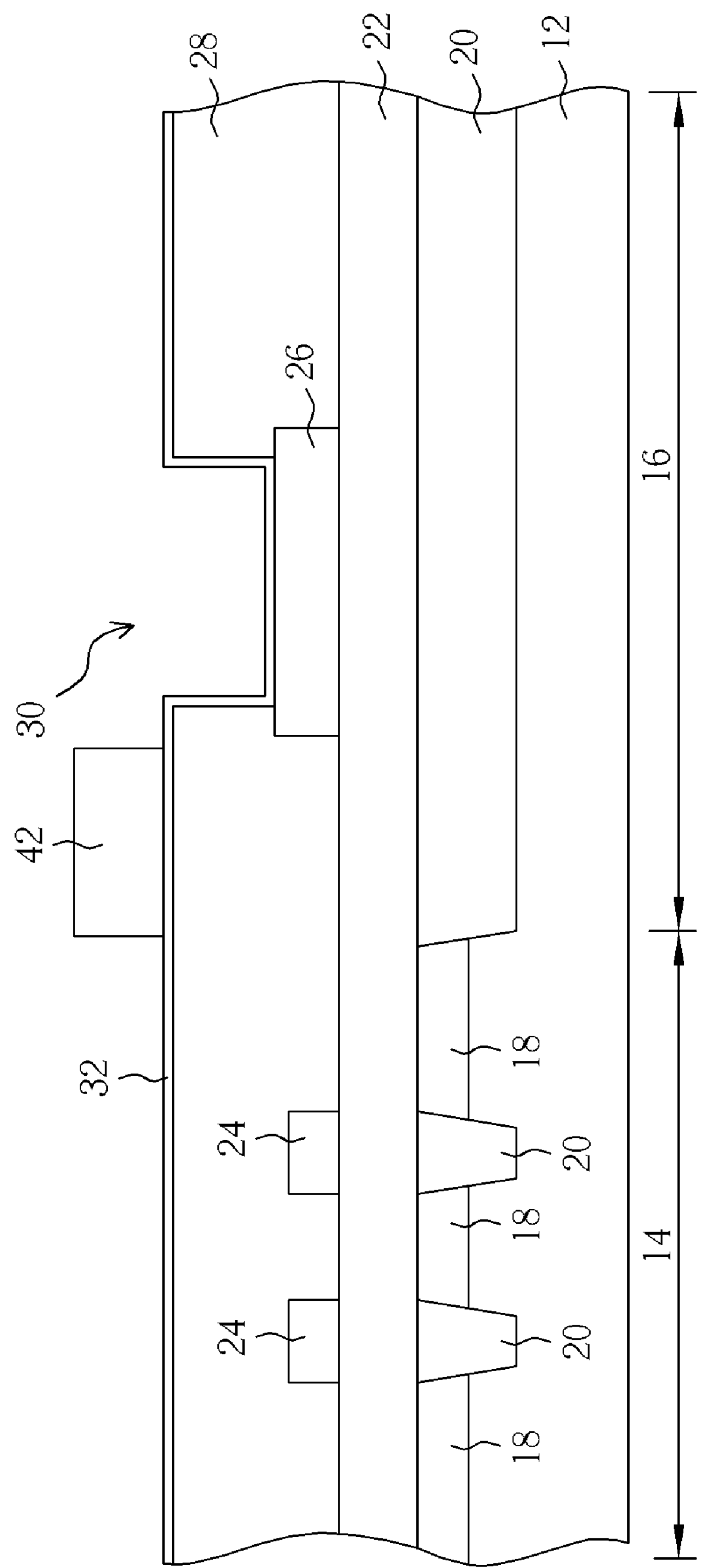
Figure 4:
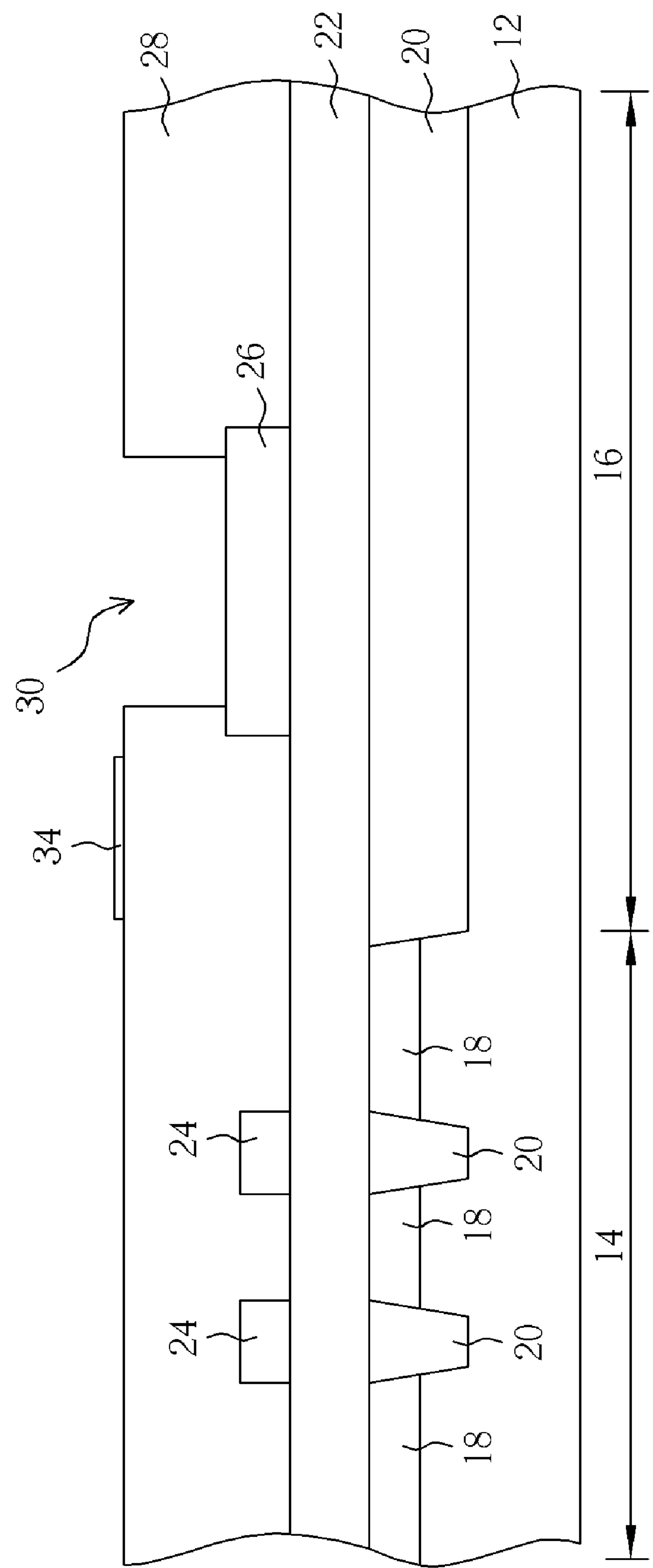
Figure 5:
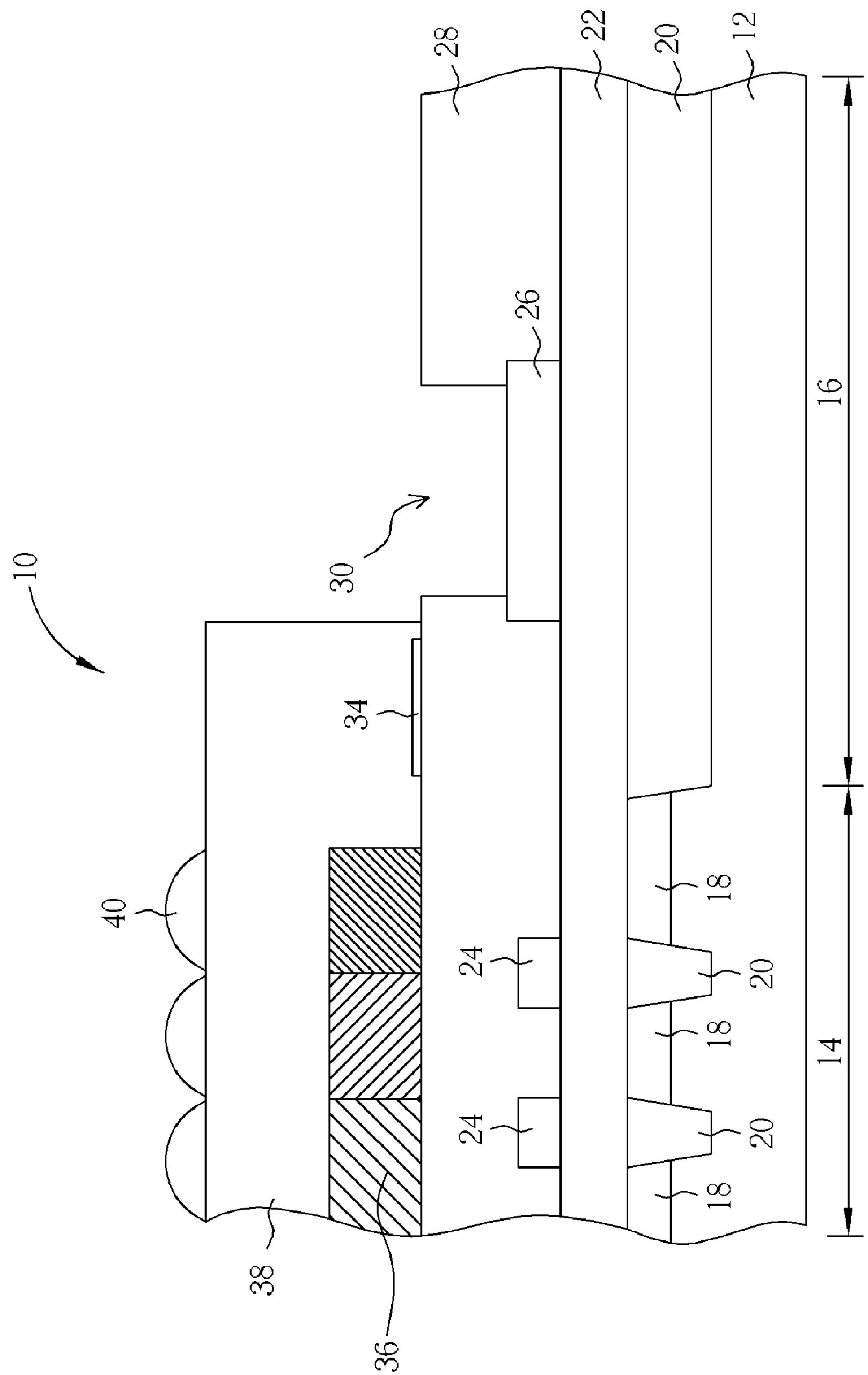
Figure 6:
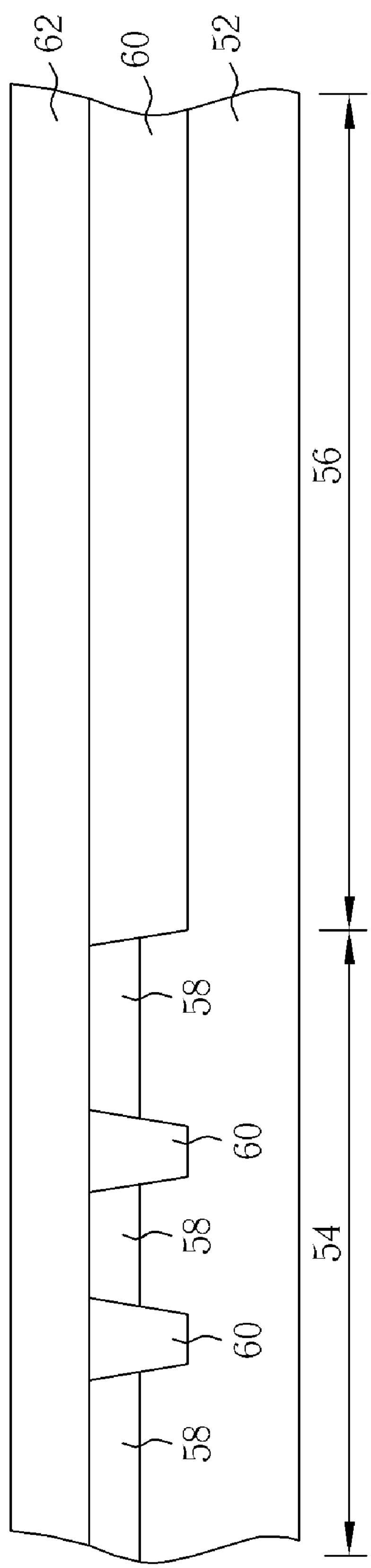
FIGS. 6-14 are schematic drawings illustrating a first preferred embodiment provided by the present invention.

Please refer to FIGS. 6-14, which are schematic drawings illustrating a first preferred embodiment provided by the present invention. As shown in FIG. 6, a substrate 52 having a sensor array region 54 and a peripheral region 56 defined thereon is provided. A plurality of photodiodes 58 for receiving light, a plurality of insulators such as shallow trench isolations (STIs) 60 positioned in between each photodiode 58, and a plurality of CMOS transistors (not shown) are formed in the substrate 52. Then, at least a dielectric layer 62 is formed on the substrate 52.

Figure 7:
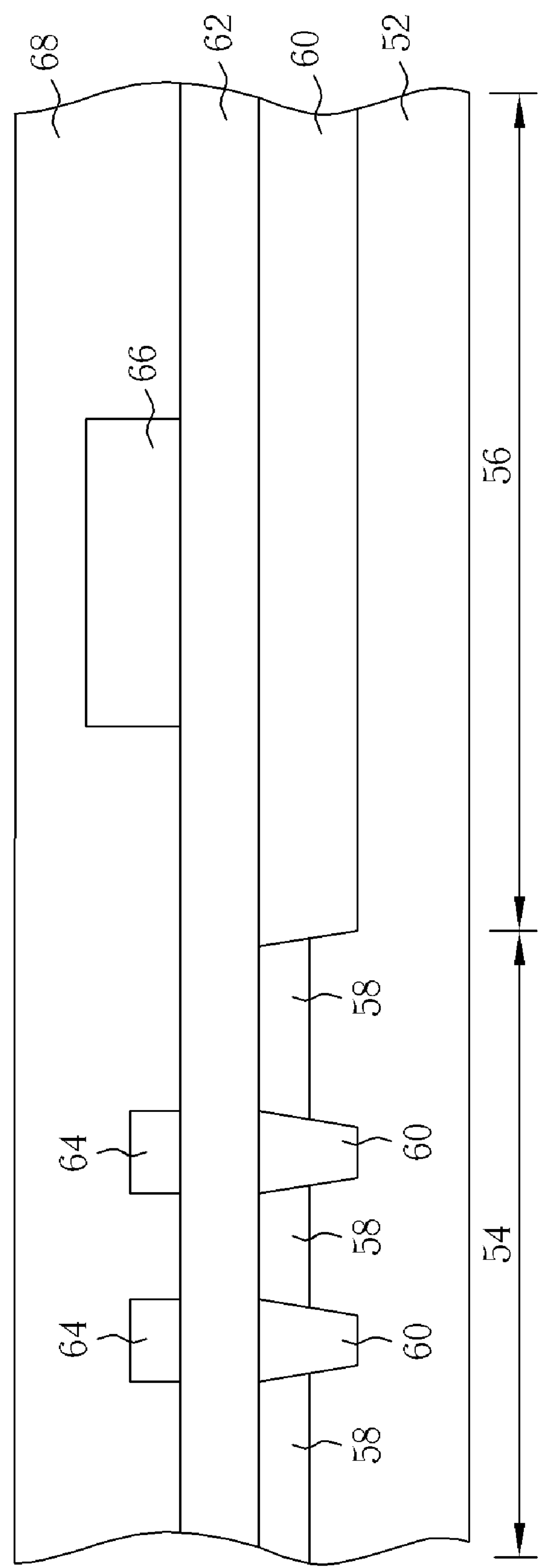

Please refer to FIG. 7. At least a metal interconnection process is performed thereafter. As shown in FIG. 7, a plurality of patterned metal layers 64 are formed on the dielectric layer 62 of the sensor array region 54 for forming metal interconnects of the CMOS image sensors and for shielding scattering light. And at least a patterned metal layer is formed on the dielectric layer 62 of the peripheral region 56 by the same or different metal interconnection process for forming a contact pad 66 which provides electrical connection with external elements. Then, another dielectric layer 68 covering the patterned metal layer 64 and the contact pad 66 is formed on the substrate 52.

Figure 8:
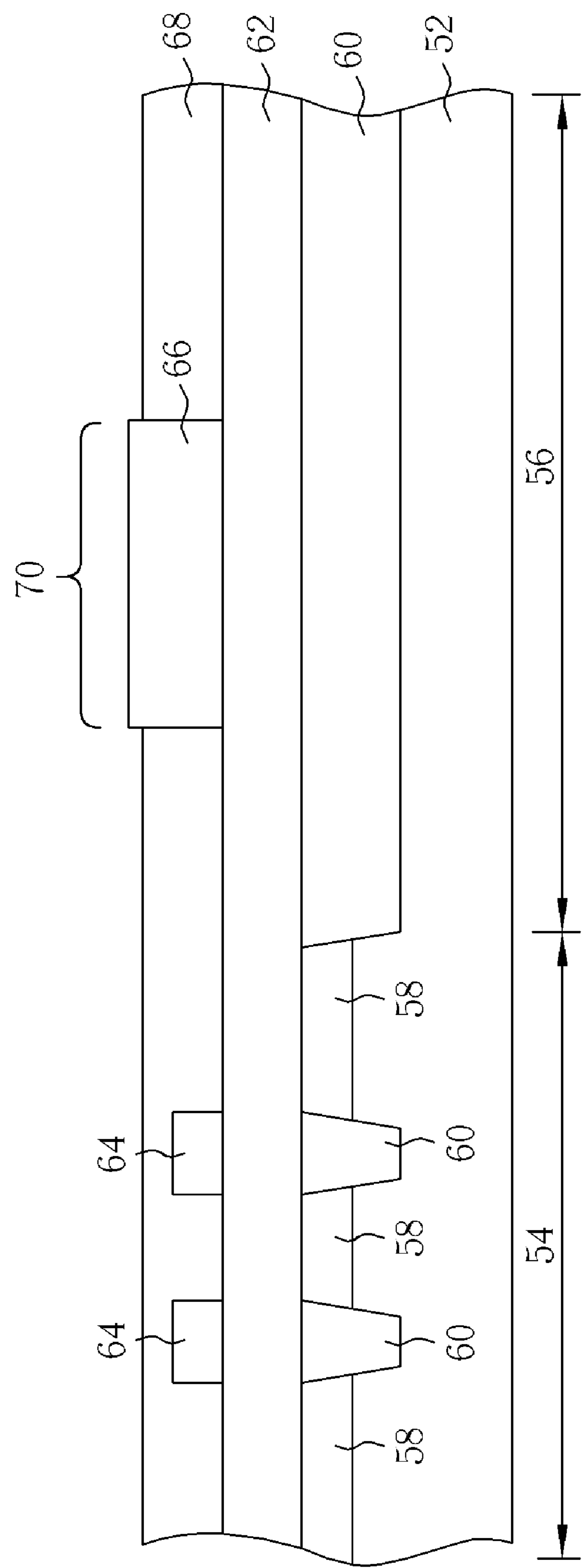

Please refer to FIG. 8. A first etching process is performed to remove a portion of the dielectric layer 66 and to expose the contact pad 66, thus a step height 70 having a range of 1000-2000 angstroms is formed.

Figure 9:
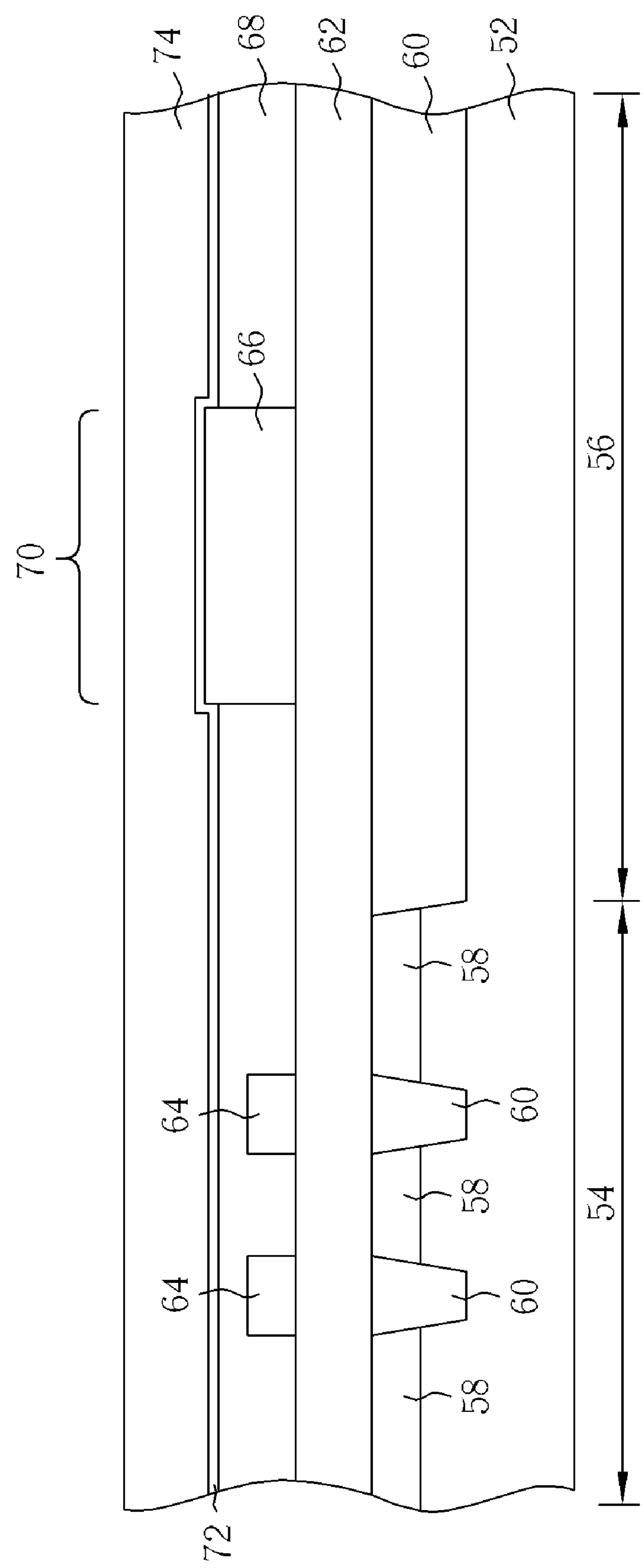
Figure 10:
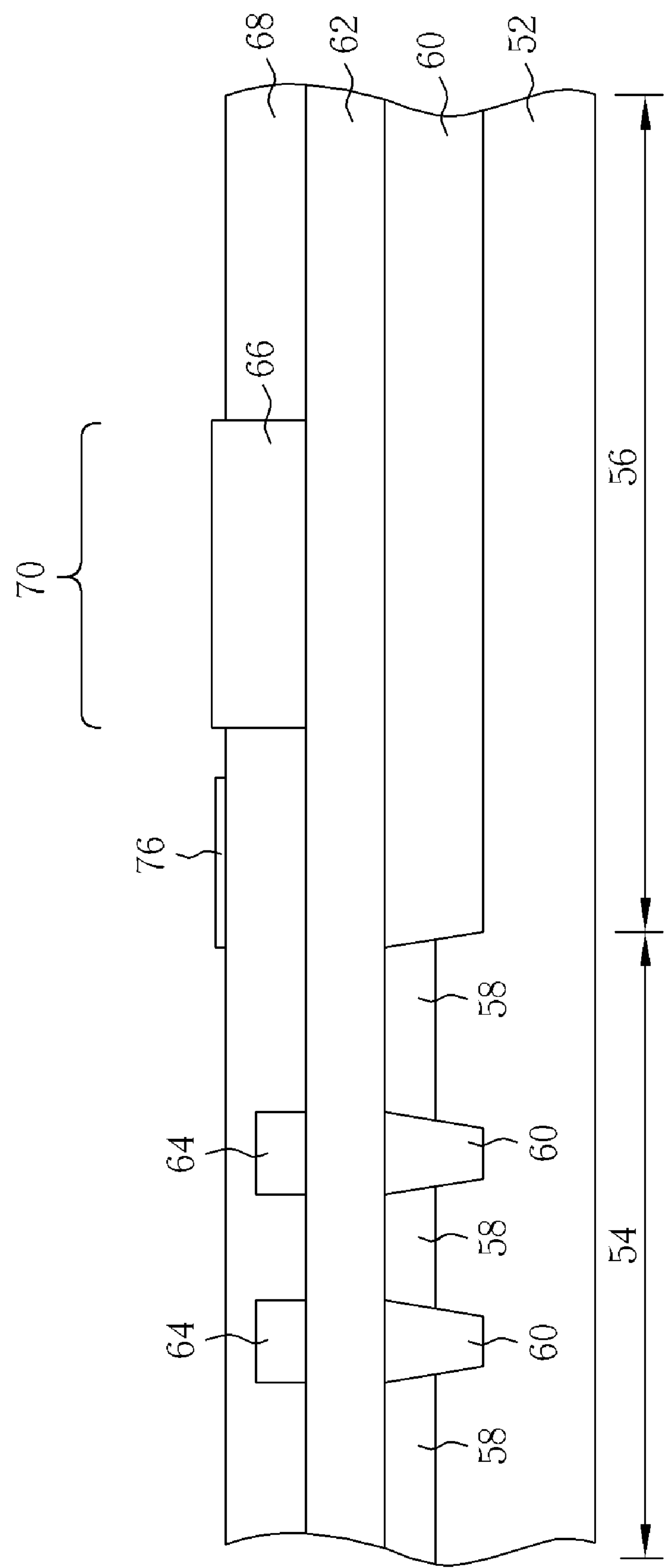

Please refer to FIGS. 9-10. Next, a step of forming an optical shielding layer is performed according to the following description. A cap layer 72 comprising opaque metal material such as titanium or titanium nitride is firstly formed on the dielectric layer 68, and a photoresist layer 74 is formed on the cap layer 72. Then a photomask having an optical shielding layer pattern is provided and exposure and development processes are performed to transfer the pattern to the photoresist layer 74. By an etching step with the patterned photoresist layer 74 being an etching mask, an optical shielding layer 76 is formed in the peripheral region 56 adjacent to the sensor array region 54 as shown in FIG. 10. Please note that a problem of alignment between the photomask and the substrate 52 should happen in practice since the cap layer 72 is an opaque layer and it completely covers the dielectric layer 68 and the contact pad 66. However, according to the method provided by the first embodiment, the step height 70 serves as an alignment mark in the alignment step for aligning the photomask with the substrate 52, therefore the problem mentioned above is thoroughly overcome and the optical shielding layer 76 is formed in the accurate position.

Figure 11:
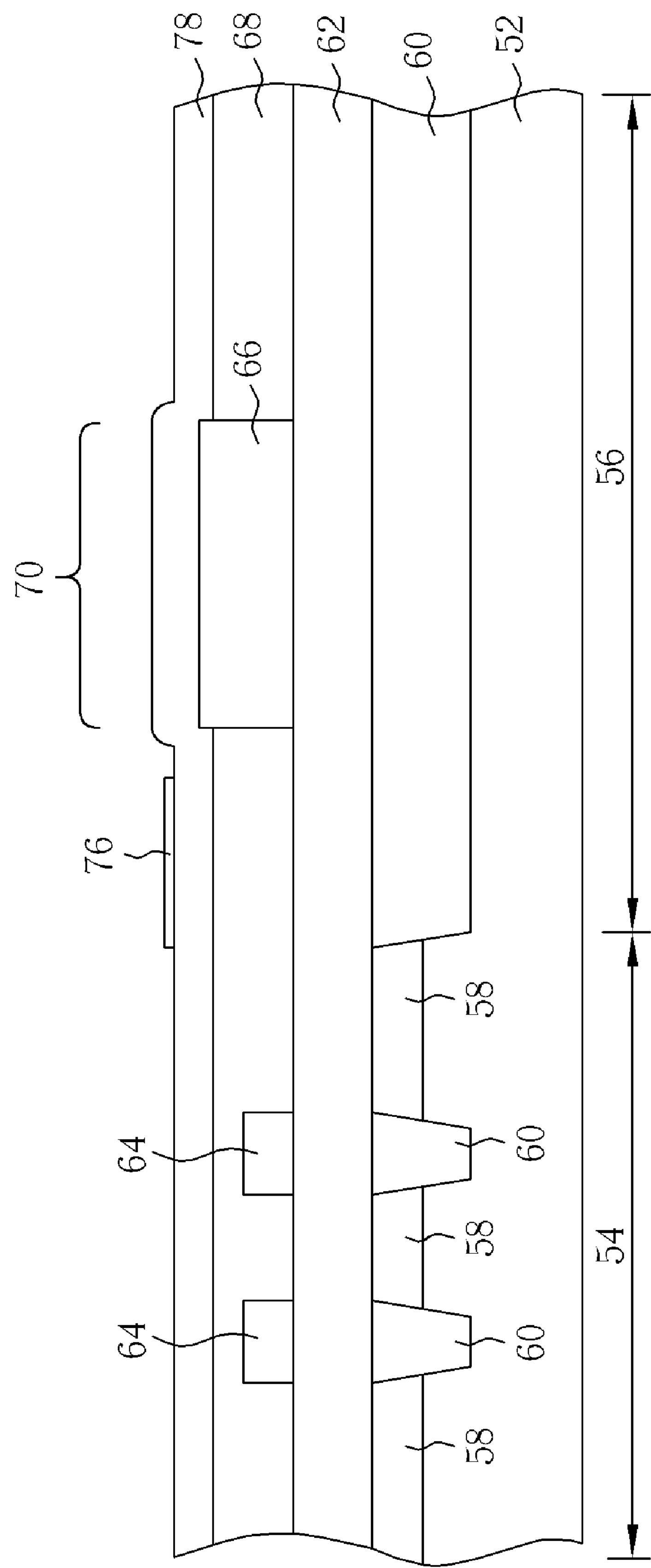

Additionally, because cap layer 72 and the contact pad 66 are both made of metal, the lower etching ratio between the cap layer 72 and the contact pad 66 might cause damages to the contact pad 66 during forming the optical shielding layer 76. Therefore another dielectric layer 78 covering the dielectric layer 68 and the contact pad 66 can be formed on the substrate 52 before the step of forming the optical shielding layer in the first preferred embodiment as shown in FIG. 11. It is noteworthy that the a step height 70 having a range of 1000-2000 angstroms is formed at where the contact pad 66 is after forming the dielectric layer 78. The step height is also used as an alignment mark between the photomask and the substrate 52 in the alignment step in the step of forming the optical shielding layer.

As mentioned above, a photoresist layer 74 is formed on the cap layer 72 and a photomask with an optical shielding layer pattern is provided. With an alignment step, an exposure and developments process, and an etching step, the cap layer 72 is patterned to form an optical shielding layer 76 on the dielectric layer 78 of the peripheral region 56 adjacent to the sensor array region 54. Therefore the dielectric layer 78 protects the contact pad 66 from damage caused in the etching step for forming the optical shielding layer 76.

Figure 12:
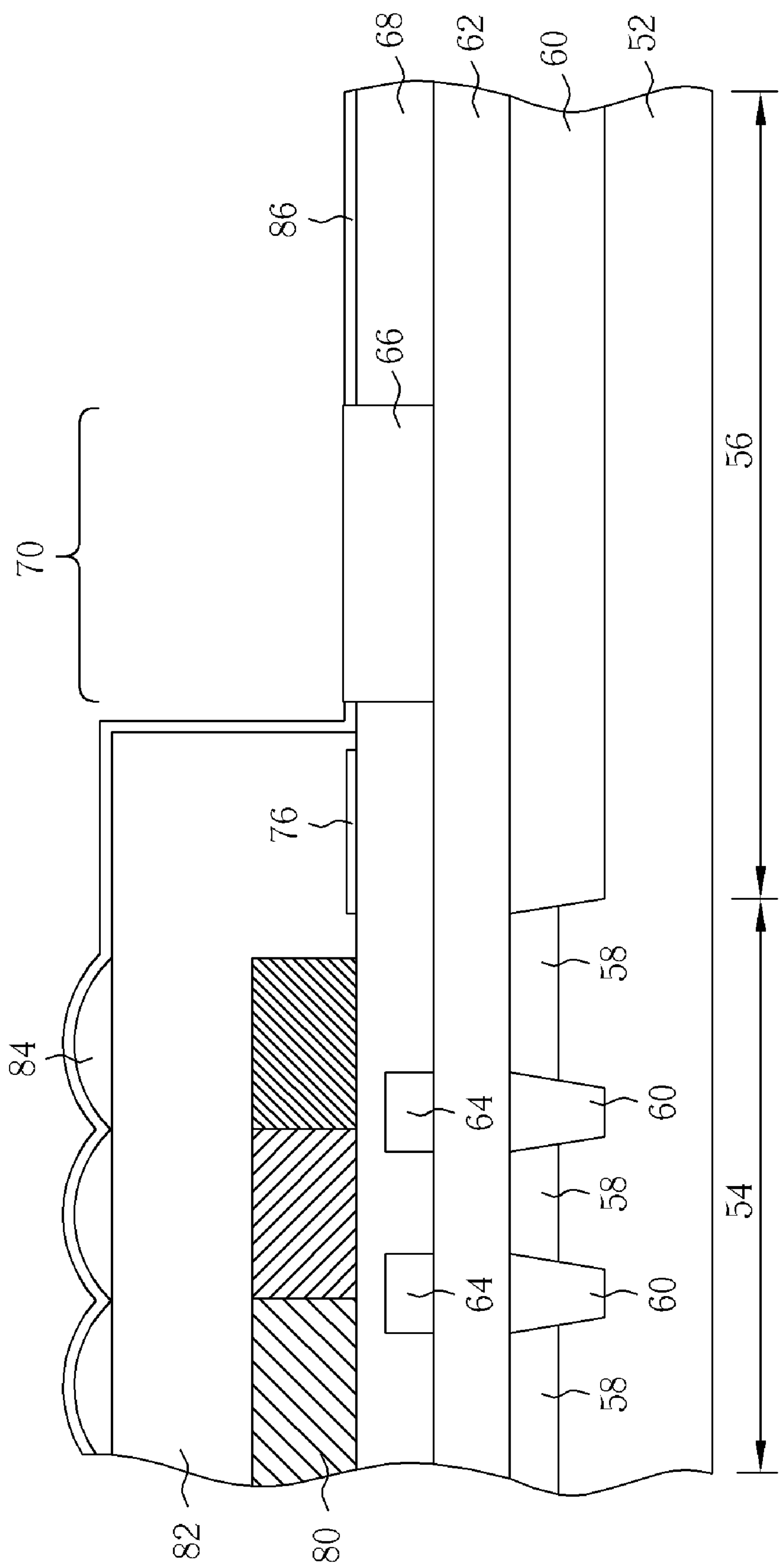

Please refer to FIG. 12. A plurality of color filters 80 are formed on the dielectric layer 68 of the sensor array region 54 thereafter. The steps for forming the color filters 80 can be summarized as follows: performing a first spin coating process to form a first color filter layer (not shown) on the substrate 52 and a first pattern transferring step is performed with a photomask having a first color filter pattern to form at least a first color filter on the dielectric layer 68 of the sensor array region 54. Then a second spin coating process is performed to form a second color filter layer (not shown) on the substrate 52 and a second pattern transferring step is performed with a photomask having a second color filter pattern to form at least a second color filter on the dielectric layer 68 of the sensor array region 54. And a third spin coating process is performed to form a third color filter layer (not shown) on the substrate 52 and a third pattern transferring step is performed with a photomask having a third color filter pattern to form at least a third color filter on the dielectric layer 68 of the sensor array region 54. After forming the color filters 80, a planarizing layer 82 is formed on the color filters 80 and the optical shielding layer 76 by a deposition and an etching process. Then, a plurality of micro-lenses 84 are formed on the planarizing layer 82 and a protecting layer 86 is selectively formed on the substrate 52.

Figure 13:
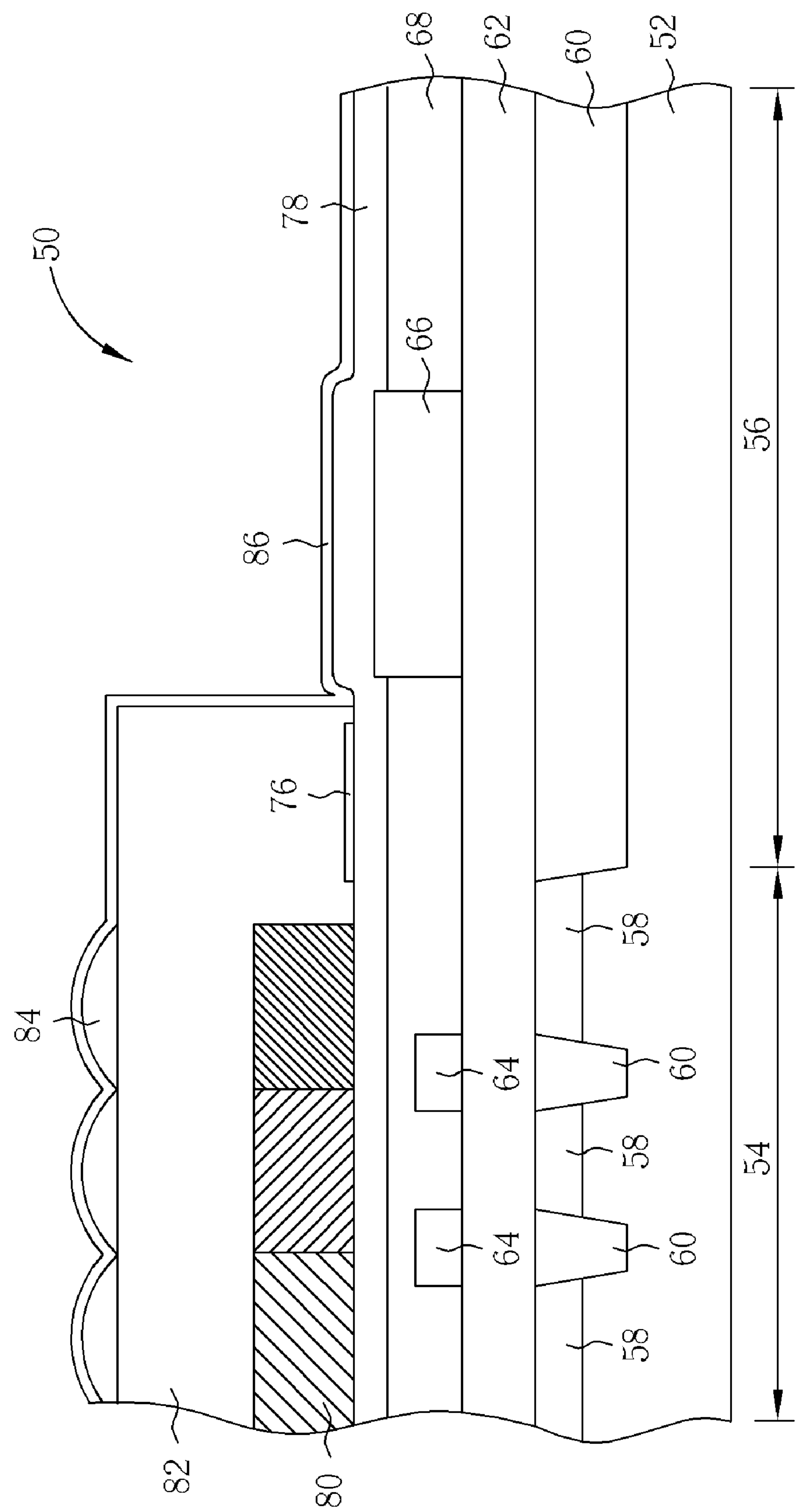
Figure 14:
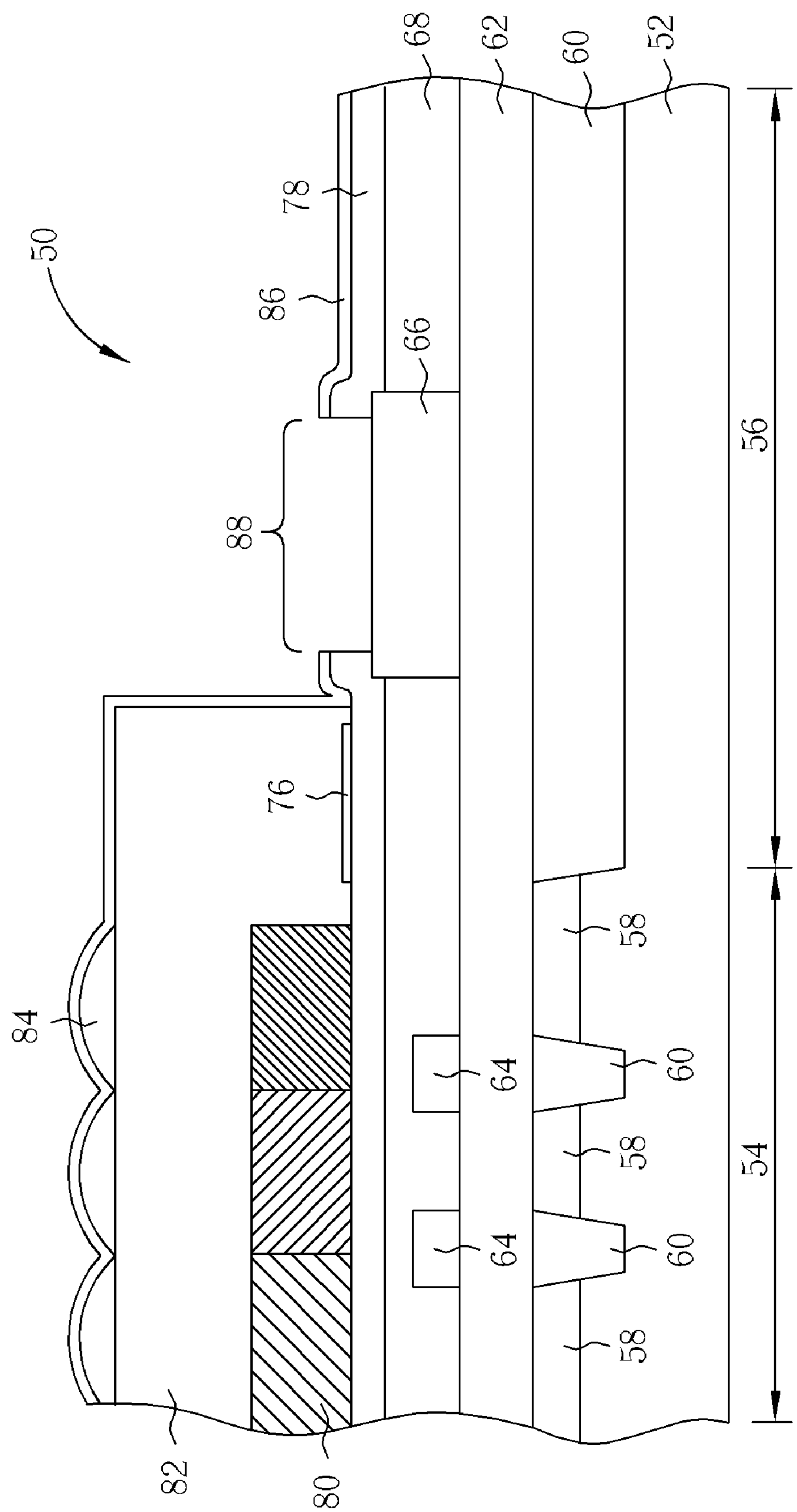

Please refer to FIGS. 13-14. Additionally, when the dielectric layer 78 covering the dielectric layer 68 and the contact pad 66 is formed in the first preferred embodiment, the color filters 80, the planarizing layer 82, the micro-lenses 84, and the selectively formed protecting layer 86 are sequentially formed on the dielectric layer 78 according to the steps described above. In this case, a second etching process is performed after forming the micro-lenses 84 and the protecting layer 86 to remove a portion of the protecting layer 86 and the dielectric layer 78 and to form an opening 88 which exposes the contact pad 66 as shown in FIG. 14. In addition, the second etching process can be performed right after forming the micro-lenses 84. Thus the back-end-of-line process of a CMOS image sensor 50 is completed.

It is noteworthy that according to the method provided by the first preferred embodiment, there is no notch or recess existing on the substrate 52, therefore the first, the second, and the third color filter layers which are formed on the dielectric layer 68/78 by the spin coating process will not store up in any notch/recess and thus striation is prevented.

Figure 15:
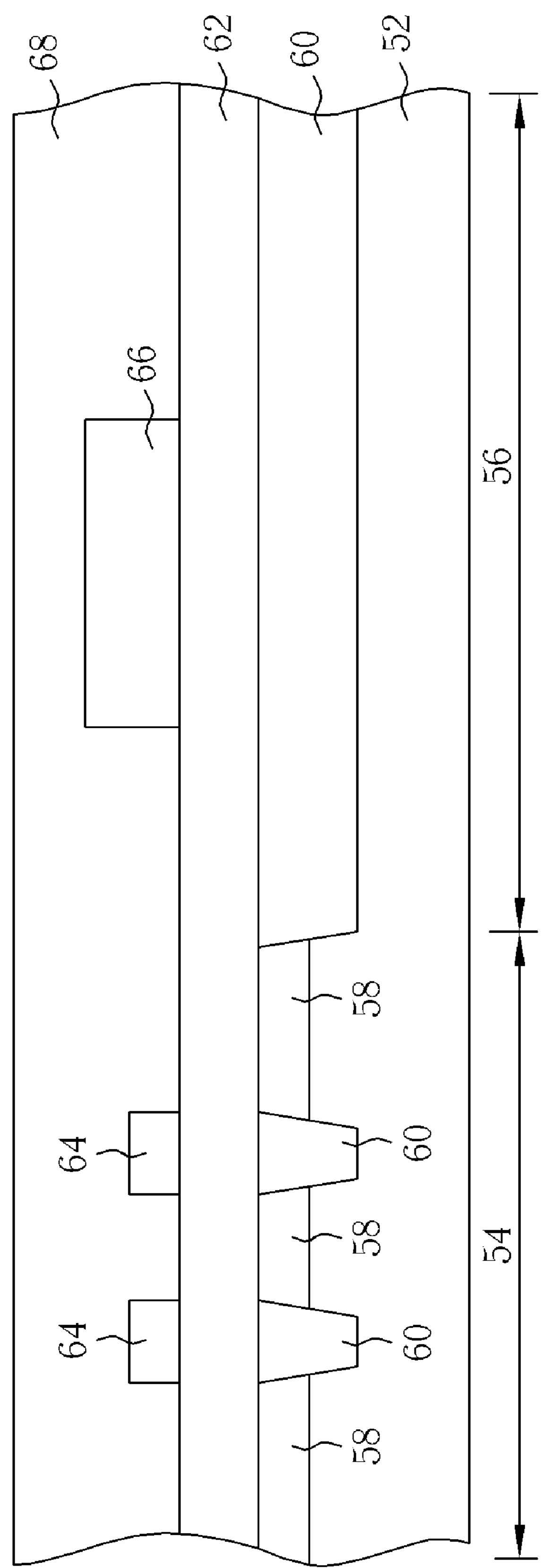
FIGS. 15-21 are schematic drawings illustrating a second preferred embodiment provided by the present invention.

Please refer to FIGS. 15-21, which are drawings illustrating a second preferred embodiment provided by the present invention. Please note that in the interest of brevity and clarity, the same elements in FIGS. 15-21 and FIGS. 6-14 share the same numerals. First, as shown in FIG. 15, a substrate 52 having a sensor array region 54 and a peripheral region 56 defined thereon is provided. A plurality of photodiodes 58 for receiving light, a plurality of insulators such as shallow trench isolations (STIs) 60 positioned in between each photodiode 58, and a plurality of CMOS transistors (not shown) are formed in the substrate 52. Then, at least a dielectric layer 62 is formed on the substrate 52.

Please refer to FIG. 15 again. At least a metal interconnection process is performed thereafter. As shown in FIG. 15, a plurality of patterned metal layers 64 are formed on the dielectric layer 62 of the sensor array region 54 for forming metal interconnects of the CMOS image sensor and for shielding scattering light. And at least a patterned metal layer is formed on the dielectric layer 62 of the peripheral region 56 by the same or different metal interconnection process for forming a contact pad 66 which provides electrical connection with external elements. Then, another dielectric layer 68 covering the patterned metal layer 64 and the contact pad 66 is formed on the substrate 52.

Figure 16:
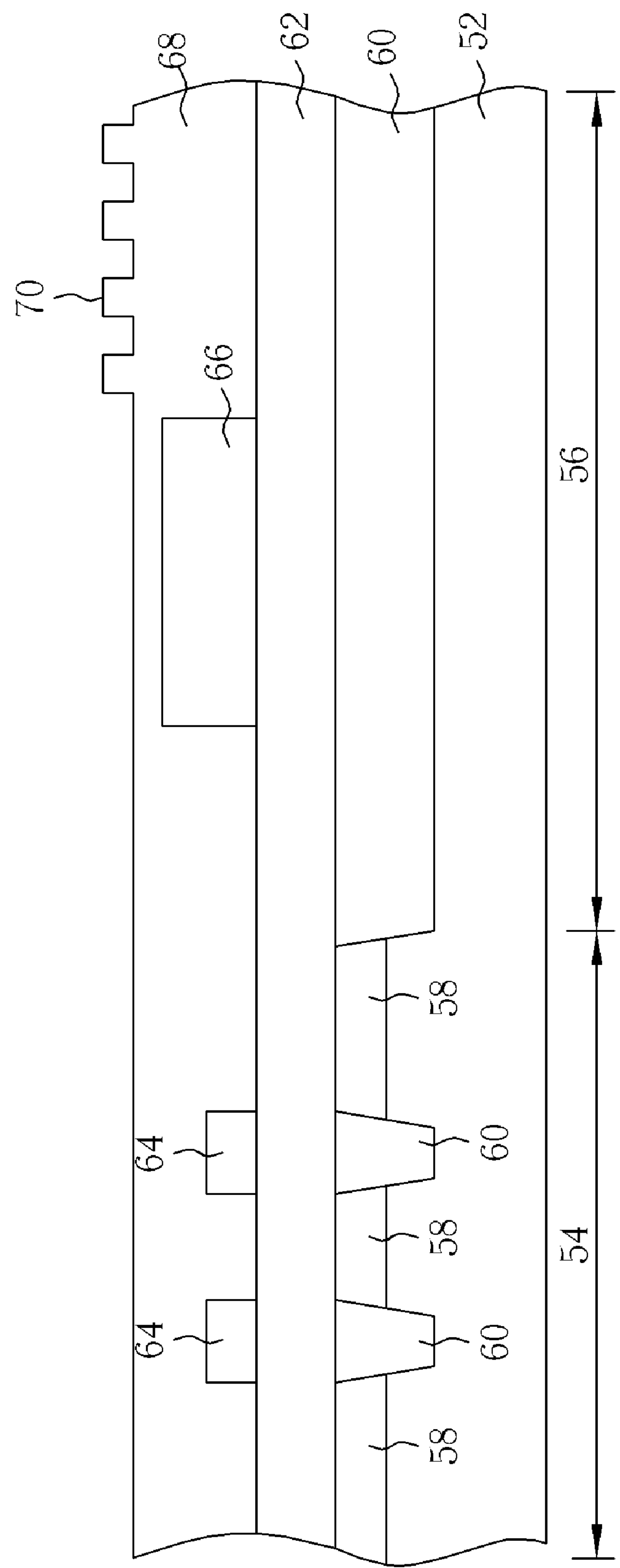
Figure 17:
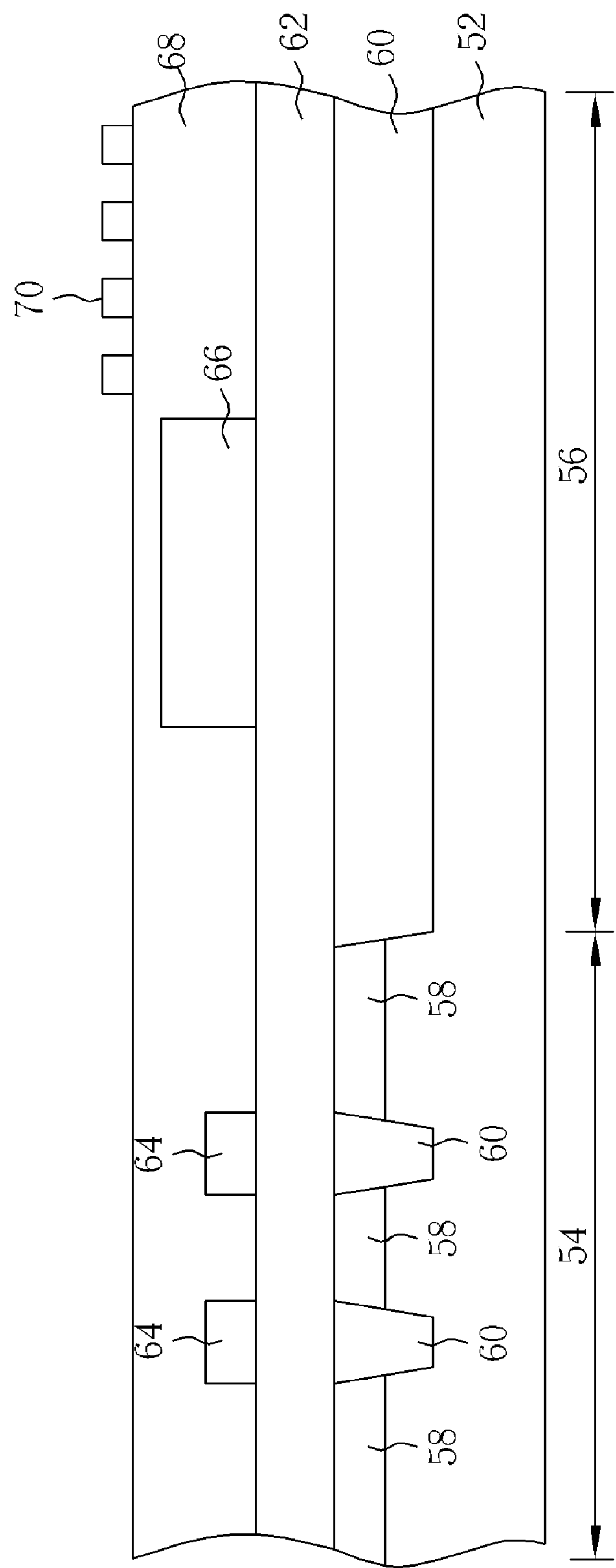

Please refer to FIG. 16. A first etching process is performed to remove a portion of the dielectric layer 68 and thus a plurality of step heights 70 having a range of 1000-2000 angstroms are formed on the substrate 52. Additionally, depending on requirements of different processes, another dielectric layer (not shown) can be formed on the dielectric layer 68 and etched by the first etching process to form the step heights 70 as shown in FIG. 17.

Figure 18:
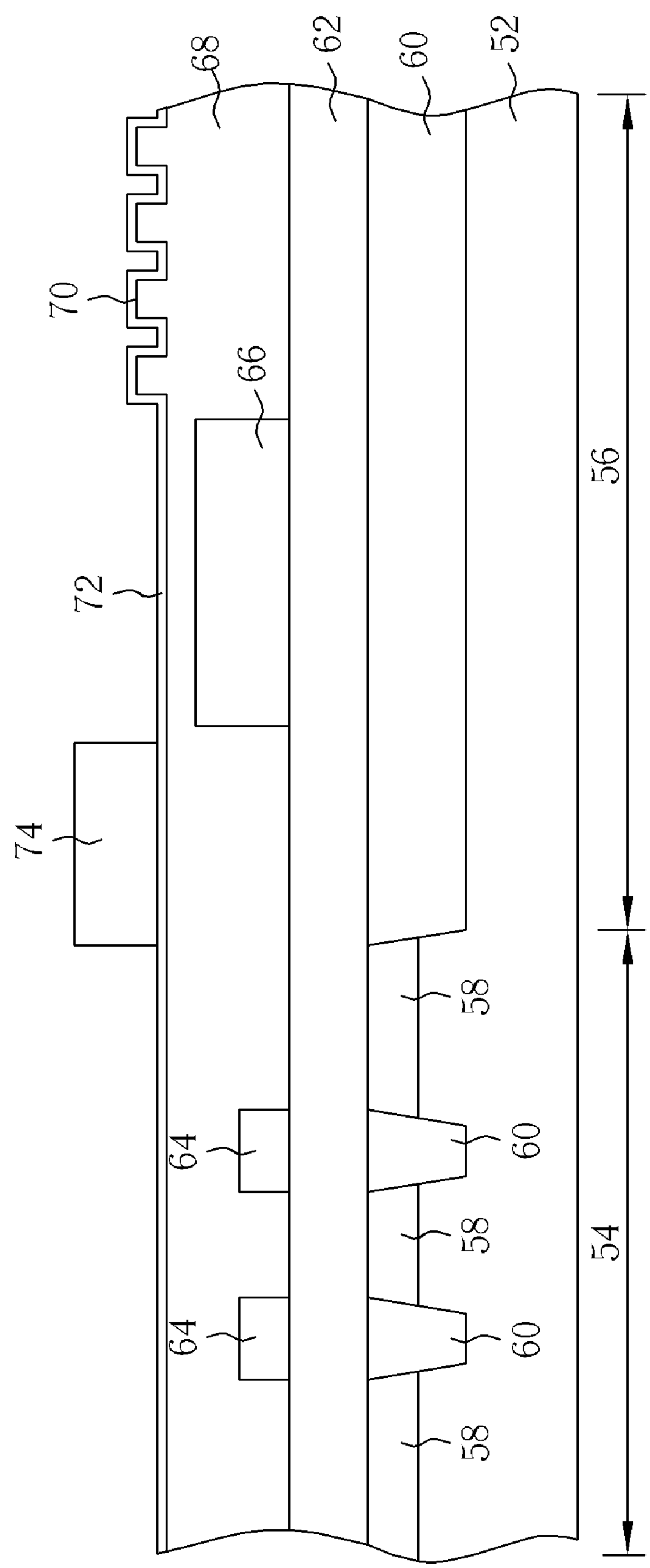
Figure 19:
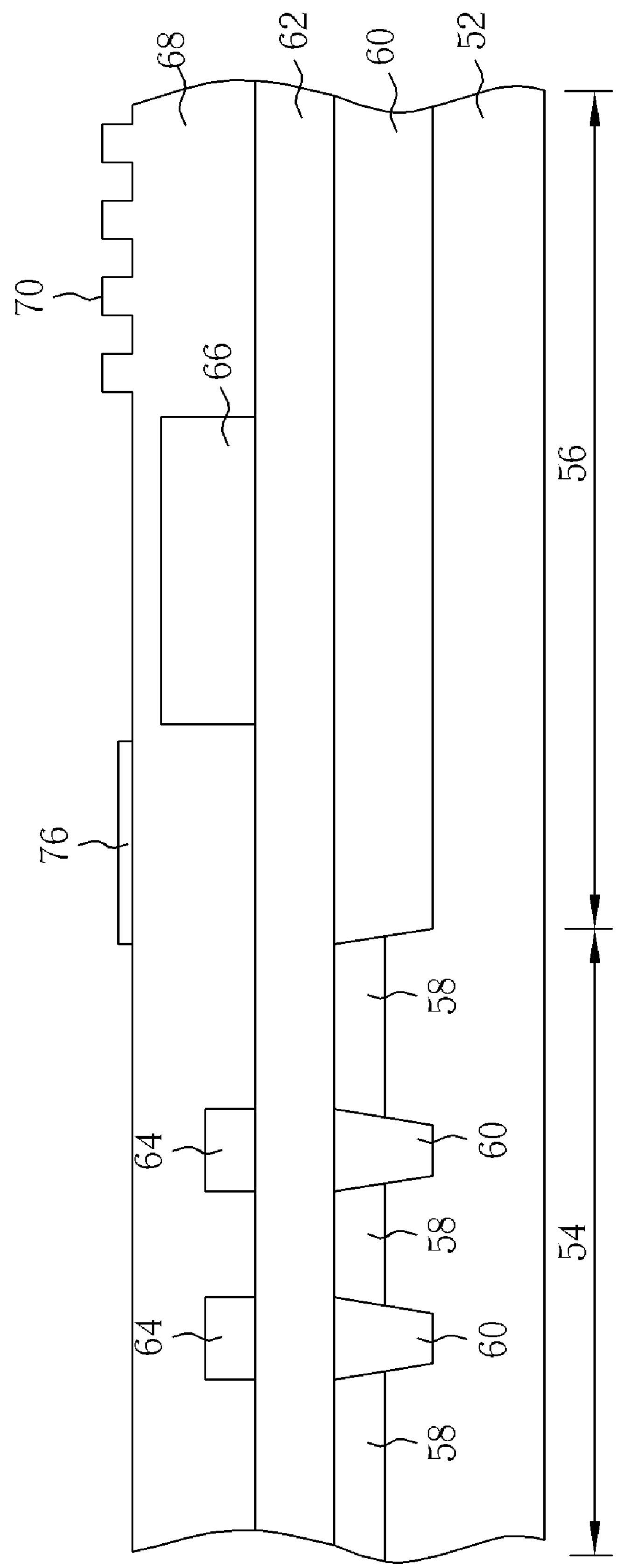

Please refer to FIGS. 18-19. Next, a step for forming an optical shielding layer is performed according to the following description. First, a cap layer 72 comprising opaque metal material such as titanium or titanium nitride is formed on the dielectric layer 68, and a photoresist layer is formed on the cap layer 72. Then, a photomask having an optical shielding layer pattern is provided and exposure and development processes are performed to transfer the pattern to the photoresist. By an etching step with the patterned photoresist 74 being an etching mask, an optical shielding layer 76 is formed in the peripheral region 56 adjacent to the sensor array region 54 as shown in FIG. 19.

Please note that a problem of alignment between the photomask and the substrate 52 should happen in practice since the cap layer 72 is an opaque layer and it completely covers the dielectric layer 68 and the contact pad 66. However, according to the method provided by the second embodiment, the step heights 70 serve as alignment marks in the alignment step for aligning the photomask with the substrate 52. Therefore the problem mentioned above is thoroughly overcome and the optical shielding layer 76 is formed in the accurate position. Additionally, since only a portion of the dielectric layer 68 is removed to form the step heights, and the contact pad 66 is not exposed in the second preferred embodiment, damage to the contact pad 66 due to the low etching ratio between the optical shielding layer 76 and the contact pad 66 is also prevented.

Figure 20:
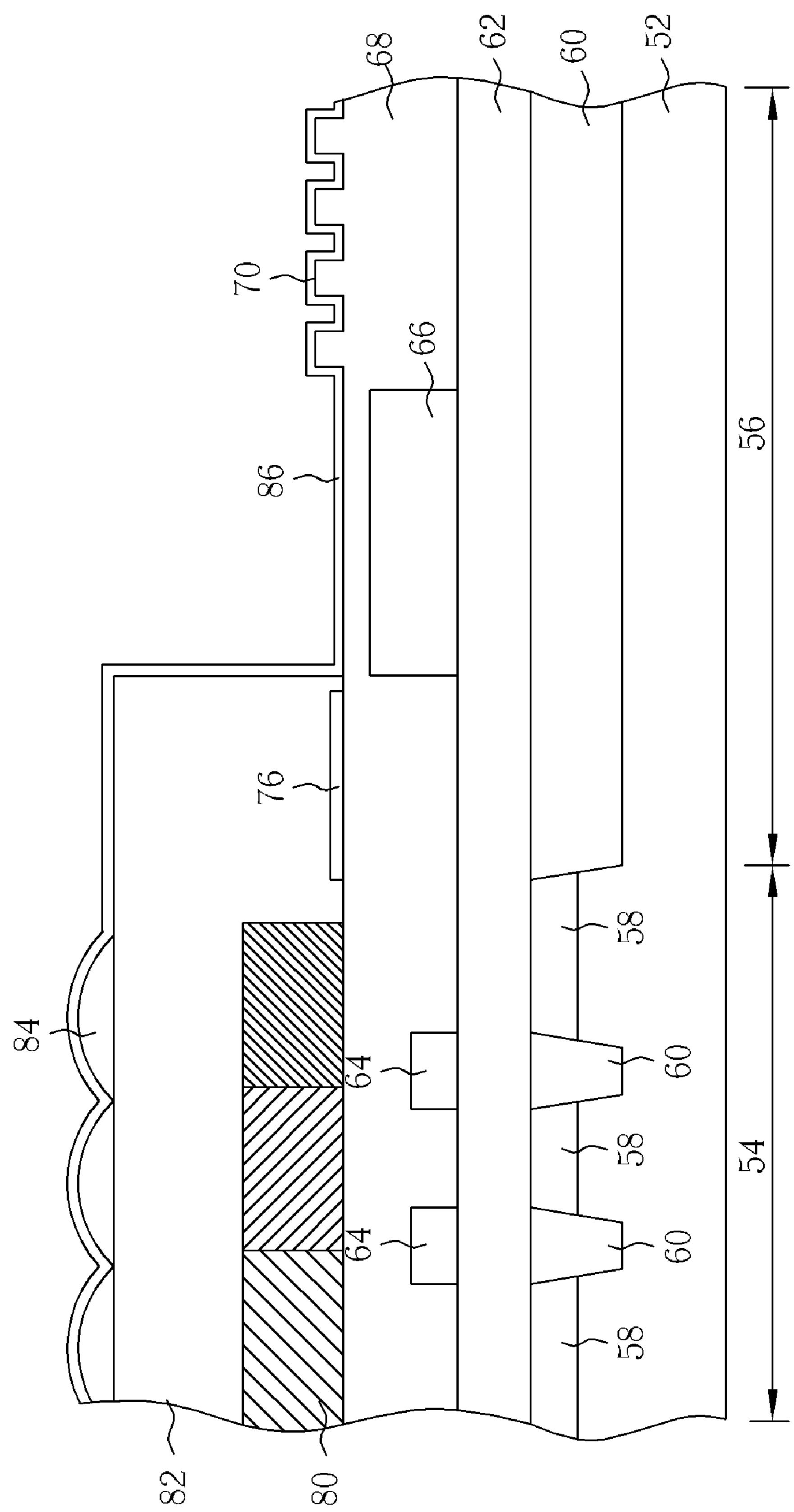

Please refer to FIG. 20. A plurality of color filters 80 are formed on the dielectric layer 68 of the sensor array region 54 thereafter. The steps for forming the color filters 80 can be summarized as follows: performing a first spin coating process to form a first color filter layer (not shown) on the substrate 52 and a first pattern transferring step is performed with a photomask having a first color filter pattern to form at least a first color filter on the dielectric layer 68 of the sensor array region 54. Then a second spin coating process is performed to form a second color filter layer (not shown) on the substrate 52 and a second pattern transferring step is performed with a photomask having a second color filter pattern to form at least a second color filter on the dielectric layer 68 of the sensor array region 54. And a third spin coating process is performed to form a third color filter layer (not shown) on the substrate 52 and a third pattern transferring step is performed with a photomask having a third color filter pattern to form at least a third color filter on the dielectric layer 68 of the sensor array region 54. After forming the color filters 80, a planarizing layer 82 is formed on the color filters 80 and the optical shielding layer 76 by a deposition and an etching process. Then, a plurality of micro-lenses 84 are formed on the planarizing layer 82 and a protecting layer 86 is selectively formed on the substrate 52.

Figure 21:
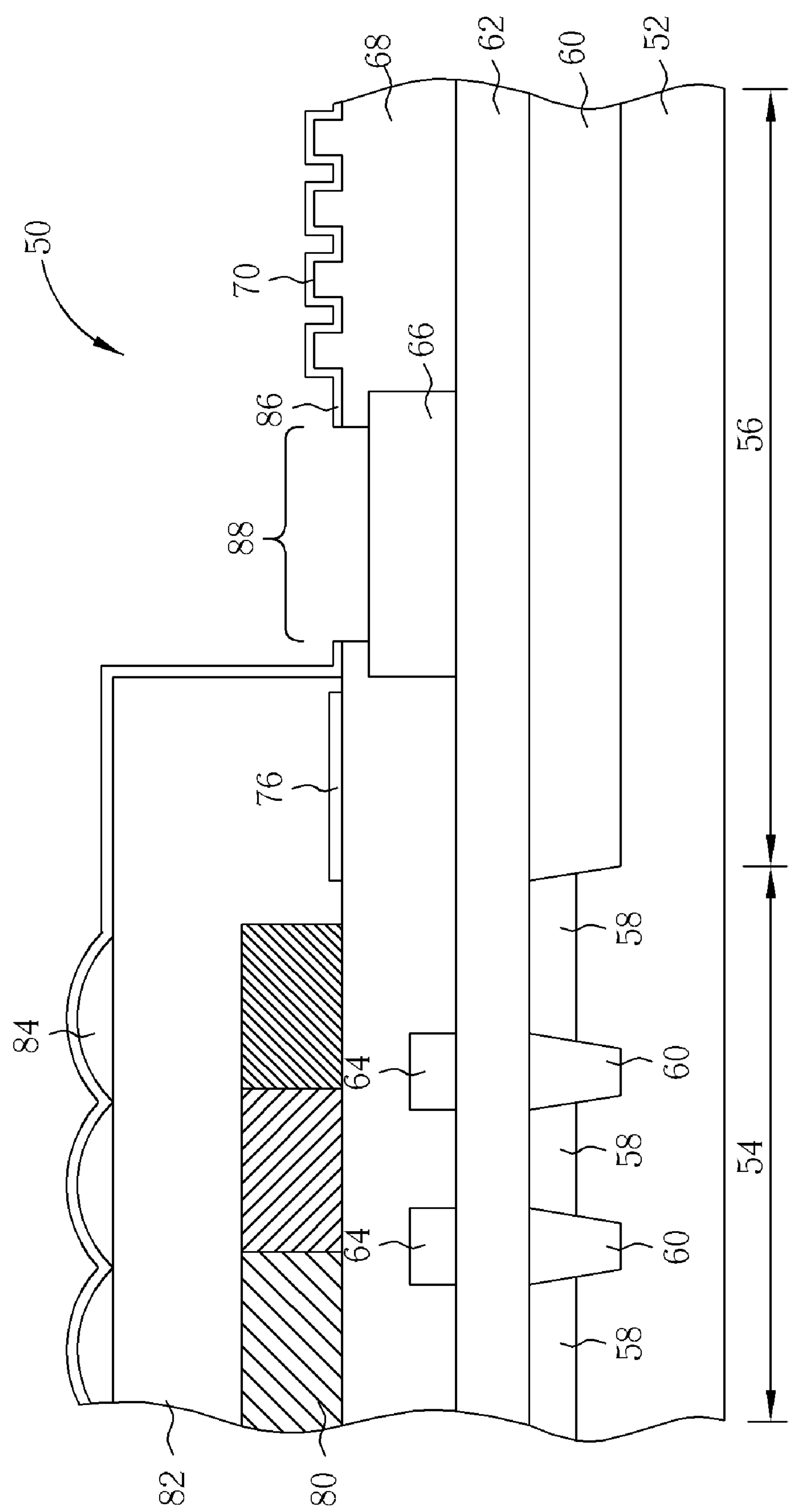

Please refer to FIG. 21. A second etching process is performed after forming the micro-lenses 84 and the protecting layer 86 to remove a portion of the protecting layer 86 and the dielectric layer 68 and to form an opening 88 which exposes the contact pad 66. In addition, the second etching process can be performed right after forming the micro-lenses 84. Thus the back-end-of-line process of a CMOS image sensor 50 is completed.

It is noteworthy that according to the method provided by the second preferred embodiment, there is no notch or recess existing on the substrate 52, therefore the first, the second, and the third color filter layers which are formed on the dielectric layer 68 by the spin coating process will not store up in any notch/recess and thus striation is prevented.

As mentioned above, according to the methods provided by the present invention, what formed on the substrate is the step height(s), not notch/recess, therefore the color filter layer would not store up in any region in the spin coating process. Thus the striation and its adverse effect on pixel performance are both prevented. In addition, the step heights, which serve as alignment marks, further improve the alignment accuracy between the photomask having the optical shielding layer pattern and the substrate when forming the optical shielding layer, therefore both the yield of the whole fabricating process and the performance of the CMOS image sensor are improved.

Those skilled in the art will readily observe that numerous modifications and alterations of the device and method may be made while retaining the teachings of the invention.

What is claimed is:

1. A method for fabricating a CMOS image sensor comprising steps of:

providing a substrate having a sensor array region and a peripheral region defined thereon;

forming at least a contact pad on the peripheral region;

forming a first dielectric layer covering the contact pad on the substrate;

performing a first etching process to remove a portion of the first dielectric for exposing the contact pad and forming a step height;

forming an optical shielding layer on the first dielectric layer of the peripheral region;

forming a plurality of color filters on the first dielectric layer of the sensor array region;

forming a planarizing layer on the color filters and the optical shielding layer; and forming a plurality of micro-lenses on the planarizing layer;

wherein the step of forming the optical shielding layer further comprises:

forming a cap layer on the first dielectric layer;

forming a photoresist layer on the cap layer;

providing a photomask having an optical shielding layer pattern and performing an alignment step;

performing exposure and development processes to pattern the photoresist layer; and forming the optical shielding layer on the first dielectric layer with the patterned photoresist layer used as an etching mask, wherein the step of forming the optical shielding layer further comprising a step of forming a second dielectric layer covering the first dielectric layer and the step height before forming the optical shielding layer, wherein the step height is used to be an alignment mark in the alignment step; and performing a second etching process to etch a portion of the second dielectric layer and to expose the contact pad after forming the micro-lenses.

2. The method of claim 1, wherein the step height has a range of 1000-2000 angstroms.

3. The method of claim 1, wherein the optical shielding layer comprises titanium or titanium nitride.

4. The method of claim 1, wherein the sensor array region comprises a plurality of photodiodes in the sensor array region and a plurality of insulators positioned between each photodiode.

5. The method of claim 1, wherein the step of forming the color filters further comprises:

performing a first spin coating process to form a first color filter layer on the substrate;

performing a first pattern transferring step to form at least a first color filter on the first dielectric layer of the sensor array region;

performing a second spin coating process to form a second color filter layer on the substrate;

performing a second pattern transferring step to form at least a second color filter on the first dielectric layer of the sensor array region;

performing a third spin coating process to form a third color filter layer on the substrate; and performing a third pattern transferring step to form at least a third color filter on the first dielectric layer of the sensor array region.

* * * * *